United States Patent
Nehete et al.

(10) Patent No.: US 8,331,082 B2
(45) Date of Patent: Dec. 11, 2012

(54) SYSTEMS, METHODS, AND APPARATUS FOR COMPONENTS IN AMI ENERGY METERS

(75) Inventors: Chandrashekhar Sadashiv Nehete, Hyderabad (IN); Sandeep Yograj Nemade, Hyderabad Andhra Pradesh (IN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/893,038

(22) Filed: Sep. 29, 2010

(65) Prior Publication Data

US 2012/0075777 A1 Mar. 29, 2012

(51) Int. Cl.
*H02B 1/00* (2006.01)

(52) U.S. Cl. .................. 361/659; 361/661; 361/663

(58) Field of Classification Search .................. None
See application file for complete search history.

(56) References Cited

U.S. PATENT DOCUMENTS

| | | | |
|---|---|---|---|
| 6,362,745 B1 | 3/2002 | Davis | |
| 7,084,783 B1 | 8/2006 | Melvin, Jr. et al. | |
| 7,541,941 B2 * | 6/2009 | Bogolea et al. | 340/870.02 |
| 2004/0243325 A1 | 12/2004 | Tate et al. | |
| 2007/0067121 A1 | 3/2007 | Przydatek et al. | |
| 2008/0224892 A1 | 9/2008 | Bogolea et al. | |
| 2009/0168307 A1 | 7/2009 | Loy et al. | |
| 2009/0259603 A1 | 10/2009 | Housh et al. | |
| 2010/0060479 A1 * | 3/2010 | Salter | 340/870.4 |
| 2011/0298284 A1 * | 12/2011 | Thomson et al. | 307/40 |

FOREIGN PATENT DOCUMENTS

| | | |
|---|---|---|
| CH | 690949 A5 | 2/2001 |
| CN | 2639893 Y | 9/2004 |
| DE | 20001278 U1 | 6/2001 |
| EP | 0 913 696 B1 | 9/2004 |
| EP | 1731914 A1 | 12/2006 |
| EP | 1764618 A2 | 3/2007 |
| EP | 2199750 A1 | 6/2010 |
| GB | 2183852 A | 6/1987 |
| NZ | 332428 A | 3/1999 |
| WO | 9805013 A1 | 2/1998 |

OTHER PUBLICATIONS

New Zealand Office Action corresponding to NZ Application No. 595320, Oct. 4, 2011.
European Search Report dated Jan. 18, 2012 of Application No. EP 11 18 1587.
Keiko Nitta, Mie Kunitoshi, Yoshihide Goto, AMI system which becomes base in smart grid (Smart Grid for Realization of Low-Carbon Society), Toshiba Corporation review, Japan, Technology Planning Division, Toshiba Corporation, Sep. 2010, vol. 65, No. 9, pp. 19-22.
Notice of Allowance for Japanese Application No. 2011-210066 mailed Jun. 12, 2012.

* cited by examiner

*Primary Examiner* — Boris Chervinsky
(74) *Attorney, Agent, or Firm* — Sutherland Asbill & Brennan LLP

(57) ABSTRACT

Certain embodiments of the invention may include systems, methods, and apparatus for providing components in advanced metering infrastructure (AMI) energy meters. According to an example embodiment of the invention, a method is provided for accessing electrical meter components, the method includes providing an energy meter enclosure having one or more service accessible compartments operable for housing AMI components, manipulating one or more compartment covers associated with the one or more service accessible compartments, installing one or more AMI components in the one or more service accessible compartments, and closing the one or more compartment covers. The energy meter enclosure protects the AMI components from at least one external element.

20 Claims, 5 Drawing Sheets

SYSTEMS, METHODS, AND APPARATUS FOR COMPONENTS IN AMI ENERGY METERS

FIELD OF THE INVENTION

This invention generally relates to energy meters, and in particular, to energy meters with Advanced Metering Infrastructure (AMI) components.

BACKGROUND OF THE INVENTION

Advanced Metering Infrastructure (AMI) refers to systems that measure, collect and analyze energy usage, and interact with advanced devices such as electricity meters, gas meters, heat meters, and water meters, through various communication media either on-demand or on pre-defined schedules. The AMI infrastructure includes hardware, software, communications, energy displays, controllers, etc.

Energy measurement devices and AMI circuit boards located at the customer premises can be used to monitor energy consumption and communicate such information to suppliers, utility companies and service providers. AMI communications may also be utilized by the utility to help consumers manually or automatically change their normal consumption patterns, for example, in response to changes in price or as incentives designed to encourage lower energy usage use at times of peak-demand periods or higher wholesale prices or during periods of low operational systems reliability.

AMI circuit boards typically require a backup power supply or battery to maintain communications and to preserve usage data during times when utility service is interrupted. AMI circuit boards, backup batteries, and other components associated with energy monitoring typically have limited lifetimes, and require servicing or replacement.

BRIEF SUMMARY OF THE INVENTION

Some or all of the above needs may be addressed by certain embodiments of the invention. Certain embodiments of the invention may include systems, methods, and apparatus for providing components in AMI energy meters.

According to an example embodiment of the invention, a method is provided for accessing electrical meter components. The method includes providing an energy meter enclosure having one or more service accessible compartments operable for housing advanced metering infrastructure (AMI) components, manipulating one or more compartment covers associated with the one or more service accessible compartments, installing one or more AMI components in the one or more service accessible compartments, and closing the one or more compartment covers. The energy meter enclosure protects the AMI components from at least one external element.

According to another example embodiment, an electrical meter system is provided. The electrical meter system includes at least one electrical power transformer, and an energy meter enclosure having one or more service accessible compartments. The service accessible compartments are operable for housing advanced metering infrastructure (AMI) components. The system also includes electrical conductors operable for delivering electrical power from the at least one electrical power transformer to the energy meter enclosure, and one or more compartment covers associated with the one or more service accessible compartments. The one or more compartment covers can be manipulated to access the one or more service accessible compartments. The electrical meter system also includes one or more replaceable AMI components in the one or more service accessible compartments.

According to another example embodiment, an apparatus is provided. The apparatus includes an energy meter enclosure having one or more service accessible compartments. The service accessible compartments are operable for housing advanced metering infrastructure (AMI) components. The apparatus also includes one or more compartment covers associated with the one or more service accessible compartments. The one or more compartment covers can be manipulated to access the one or more service accessible compartments. The apparatus also includes one or more replaceable AMI components in the one or more service accessible compartments.

Other embodiments and aspects of the invention are described in detail herein and are considered a part of the claimed inventions. Other embodiments and aspects can be understood with reference to the following detailed description, accompanying drawings, and claims.

BRIEF DESCRIPTION OF THE FIGURES

Reference will now be made to the accompanying diagrams, which are not necessarily drawn to scale, and wherein.

DETAILED DESCRIPTION OF THE INVENTION

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Certain embodiments of the invention may enable energy consumption monitoring for billing purposes and/or to alter consumption patterns. According to certain example embodiments, an energy meter and various sub-systems are provided for measuring energy consumption. In certain example embodiments of the invention, the energy meter may be equipped with one or more current transformer devices for measuring current. According to example embodiments of the invention, the current transformer may include a generic housing to accept coils supplied by multiple vendors. In certain embodiments, the generic housing may include snap-fit features that may eliminate use of screws for assembly.

Certain embodiments of the invention include a system and/or communications channel that may transfer information and/or revenue directly to or from a utility using an advanced monitoring infrastructure (AMI) card. In certain embodiments of the invention, a meter assembly is provided with an AMI compartment operable for housing the AMI card. The AMI compartment may also allow for the field replacement of the AMI card. According to example embodiments of the invention, the AMI compartment may be provided with features to accept different AMI cards from different vendors.

According to certain example embodiments of the invention, the meter assembly may also include a backup power supply compartment operable for housing a field replaceable backup battery or super capacitor. In accordance with certain embodiments of the invention, separate compartments may be provided for the AMI card and battery for safety purposes. According to example embodiments, the battery and AMI compartments may comply with the International Protection Rating IP54 (as defined, for example, in the international standard IEC 60529) requirements for dust and spraying water protection.

Various components associated with an energy meter, according to example embodiments of the invention, will now be described with reference to the accompanying figures.

Figure 1:
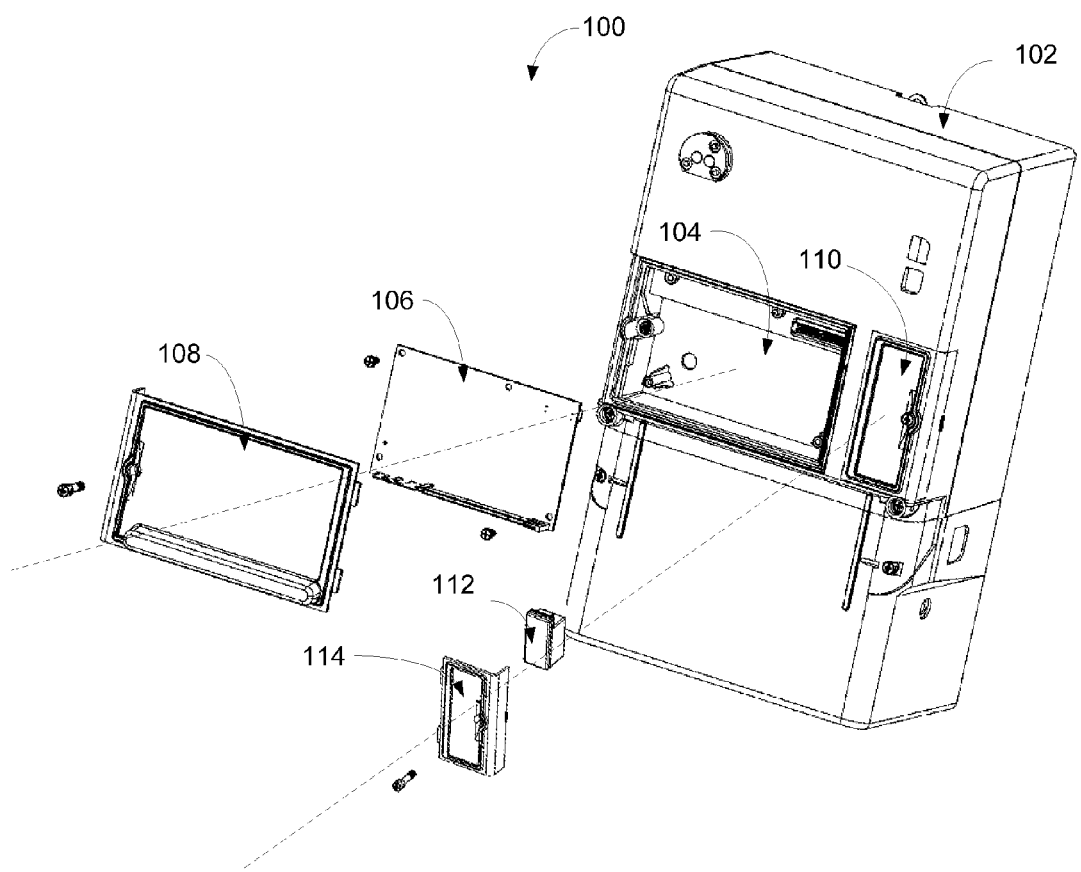
FIG. 1 is a diagram of an illustrative meter assembly according to an example embodiment of the invention.

FIG. 1 depicts a meter assembly exploded view diagram 100, according to an example embodiment of the invention. The meter enclosure 102 may include an advanced metering infrastructure (AMI) compartment 104 operable for housing an AMI card 106. According to an example embodiment of the invention, a removable AMI compartment cover 108 may cover and seal the AMI compartment 104 and may protect the AMI card 106 from environmental or external elements and/or from tampering. External elements can include, but are not limited to, sunlight, rain, snow, sand, dust, dirt, water, hail, ice, condensation, a weather-related condition, adverse temperature, or any combination thereof. In certain embodiments of the invention, the AMI compartment cover 108 may include a lock and/or special screw to prevent unauthorized access. According to an example embodiment, the AMI compartment cover 108 may be installed by inserting tabs into receiving features in the AMI compartment 104. In certain embodiments of the invention, a sealing screw with a security seal or a locking mechanism may be used to secure the AMI compartment cover 108 to the meter enclosure 102. Any person, such as an authorized person in the field, may then open the seal, remove the sealing screw or lock, and replace the AMI card 106.

According to an example embodiment, the meter enclosure 102 may also include a separate battery compartment 110 operable for housing a battery 112. In certain example embodiments of the invention, a removable battery compartment cover 114 may cover and seal the battery compartment 110 and may protect the battery 112 from environmental or external elements and/or from tampering. In certain embodiments of the invention, the battery compartment cover 114 may include a lock and/or special screw to prevent unauthorized access.

According to certain embodiments of the invention, the battery compartment 110 may include a connector interface for electrically connecting the battery with components of the energy meter, such as the AMI card 106. In certain example embodiments, the battery compartment 110 may include a snap feature for securing the battery 112 within the battery compartment 110. According to an example embodiment, the battery 112 may include one or more (female or male) headers for physically interfacing with one or more corresponding (male or female) headers associated with the battery compartment 110.

According to an example embodiment, battery compartment cover 114 may be installed by inserting tabs into receiving features in the battery compartment 110. In certain embodiments of the invention, a sealing screw with a security seal or a locking mechanism may be used to secure the battery compartment cover 114 to the meter enclosure 102. Any person, such as an authorized person in the field, may then open the seal, remove the sealing screw or lock, and replace the battery 110.

According to example embodiments of the invention, the battery 112 and the AMI card 106 may be designed to fit within separate dedicated, securable enclosures (such as 110 and 104 respectively) within the meter enclosure 102 so that no other components are accessible during service or replacement of either the battery 112 or the AMI card 106. For example, if the battery 112 needs to be replaced, then only the battery compartment cover 114 needs to be removed, and the AMI compartment cover 108 may stay attached to secure the AMI card 106.

In example embodiments of the invention, the separate enclosures may also provide a measure of safety by physically isolating the battery 112 from the AMI card 106 so that, for example, any electrolyte leakage or explosion from the battery 112 would not damage the AMI card 106. Conversely, if the AMI card 106 were to ignite, due to a power line lightning strike, for example, any damage may be contained within the AMI compartment 104, and may prevent or otherwise minimize further damage to the battery 112 or other components associated with the energy meter.

Figure 2:
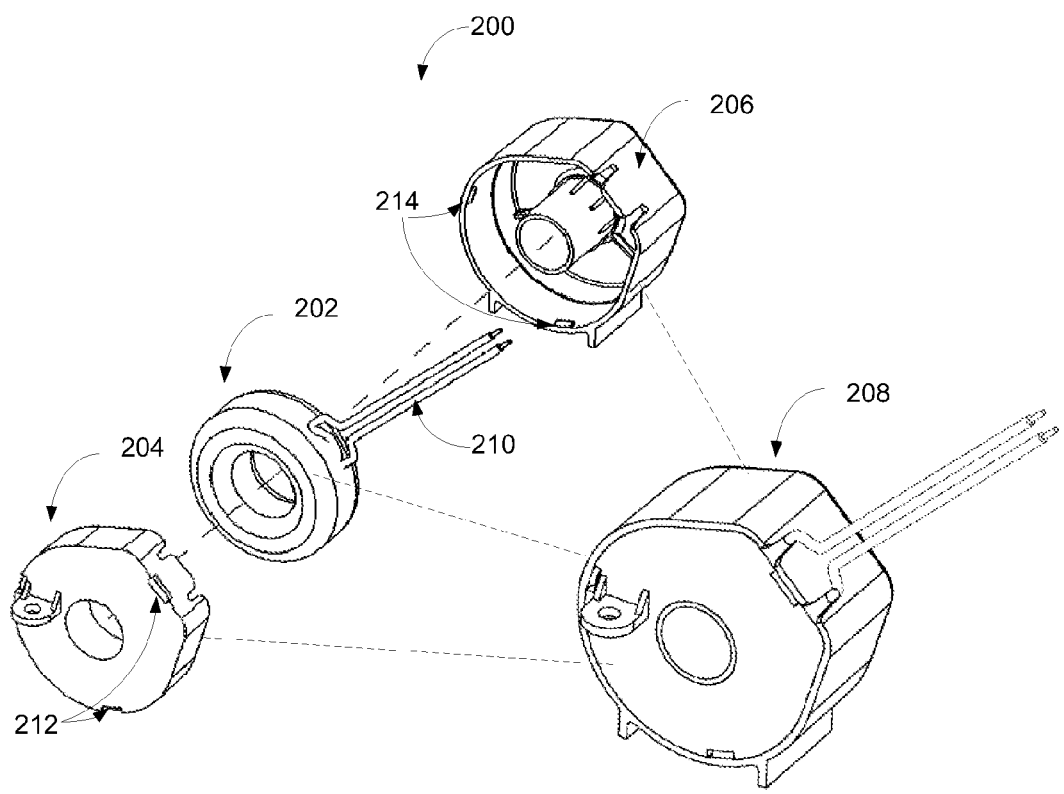
FIG. 2 is a diagram of an illustrative current transformer assembly according to an example embodiment of the invention.

FIG. 2 depicts a current transformer assembly (exploded view 200 and assembled view 208) according to an example embodiment of the invention. Example embodiments of the current transformer assembly 208 include a coil assembly 202, a cap 204, and a casing 206. According to an example embodiment, the cap 204 and casing 206 may include features for accepting and orienting the coil assembly 202 and lead wires 210 during and after assembly. In accordance with example embodiments of the invention, the coil assembly 202 may include a coil having lead wires 210 that can be connected to a metering module, for example. In certain example embodiments, the cap 204 may include one or more cap snap locking features 212, and the casing 206 may include one or more respective casing snap locking features 214 for press locking the cap 204 to the casing 206. For example, as shown in FIG. 2, the coil assembly 202 may be placed in casing 206 and the lead wires 210 may be routed from notches provided in the casing 206. Then, the cap 204 may be placed on the casing 206 and pressed until some or all the casing snap locking features 214 engage with the respective cap snap locking features 212 on the cap 204. In certain example embodiments of the invention, the press locking of the cap 204 to the casing 206 can be verified with an audible 'click' sound, or may otherwise be verified with a visual or other tactile cue.

In certain example embodiments of the invention, the cap 204 and casing 206 may accept various sizes of coil assemblies 202. For example, coil assemblies 202 obtained from different suppliers may vary in inner and/or outer diameter and/or width from about 80% to about 120% of a nominal value. In certain embodiments, the casing 206 and cap 204 may accept coil assemblies 202 that vary from about 90% to about 110% of a nominal size. Therefore, in accordance with example embodiments, the same cap 204 and casing 206 may still be used to house different sized coil assemblies 202. This provides ability to select coil assemblies 202 from various coil suppliers based on cost, rather than being locked into one particular supplier due to physical constraints of the cap 204 and casing 206.

Figure 3:
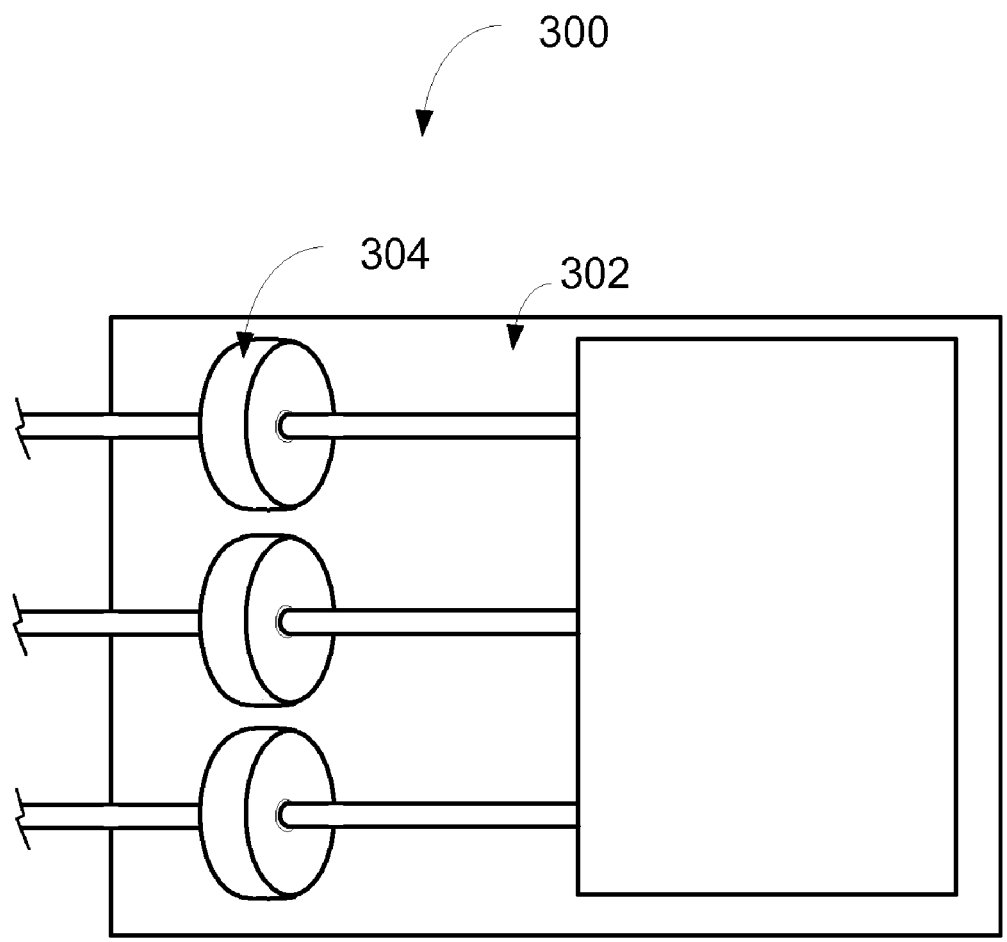
FIG. 3 is a diagram of an illustrative base assembly including current transformer assemblies, according to an example embodiment of the invention.

FIG. 3 is a diagram of an illustrative base assembly 300 according to an example embodiment of the invention. The base assembly 300 may include a current sensing assembly arrangement 302 with current transformer assemblies 304.

The current transformer assemblies 304 are assembled from caps 204, casings 206, and coil assemblies 202 (such as shown in FIG. 2). As indicated in FIG. 3, and according to an example embodiment of the invention, one conductor from a pair of power feed conductors (hot or neutral) may pass through the center of each of the coils in the coil assemblies 304. Induced current in the coil assemblies 304 may be monitored by a dedicated monitoring module in the base assembly 302 or by the AMI card 106.

Figure 4:
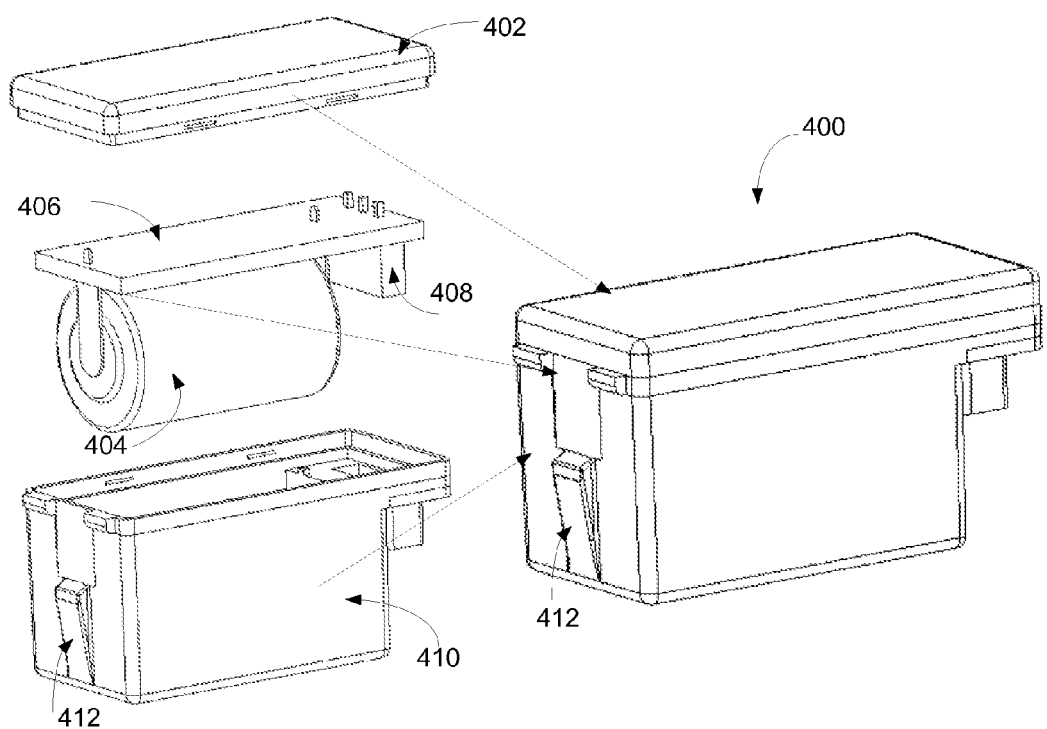
FIG. 4 is a diagram of an illustrative battery assembly, according to an example embodiment of the invention.

FIG. 4 is a diagram of a battery assembly 400, according to an example embodiment of the invention. Also shown in FIG. 4 is an exploded view of the battery assembly 400 that may include a cover 402, a battery 404 (or super capacitor), a printed circuit board assembly 406, and a battery enclosure 410. In an example embodiment, the printed circuit board assembly 406 may include a connector header 408 for connecting the battery 404 to the AMI card (such as 106 in FIG. 1) or to other electrical components associated with the energy meter. According to an example embodiment of the invention, the battery enclosure 410 may include a snap locking feature 412 for securing the battery assembly 400 within the battery compartment (such as 110 in FIG. 1).

In accordance with example embodiments of the invention, the battery assembly 400 may provide backup power for the energy meter. For example, during a power outage, the battery assembly 400 may provide power for the energy meter internal devices, and may protect utility revenue data. In certain embodiments of the invention, the energy meter may include tamper detection devices that may utilize battery power in times of power outage.

Figure 5:
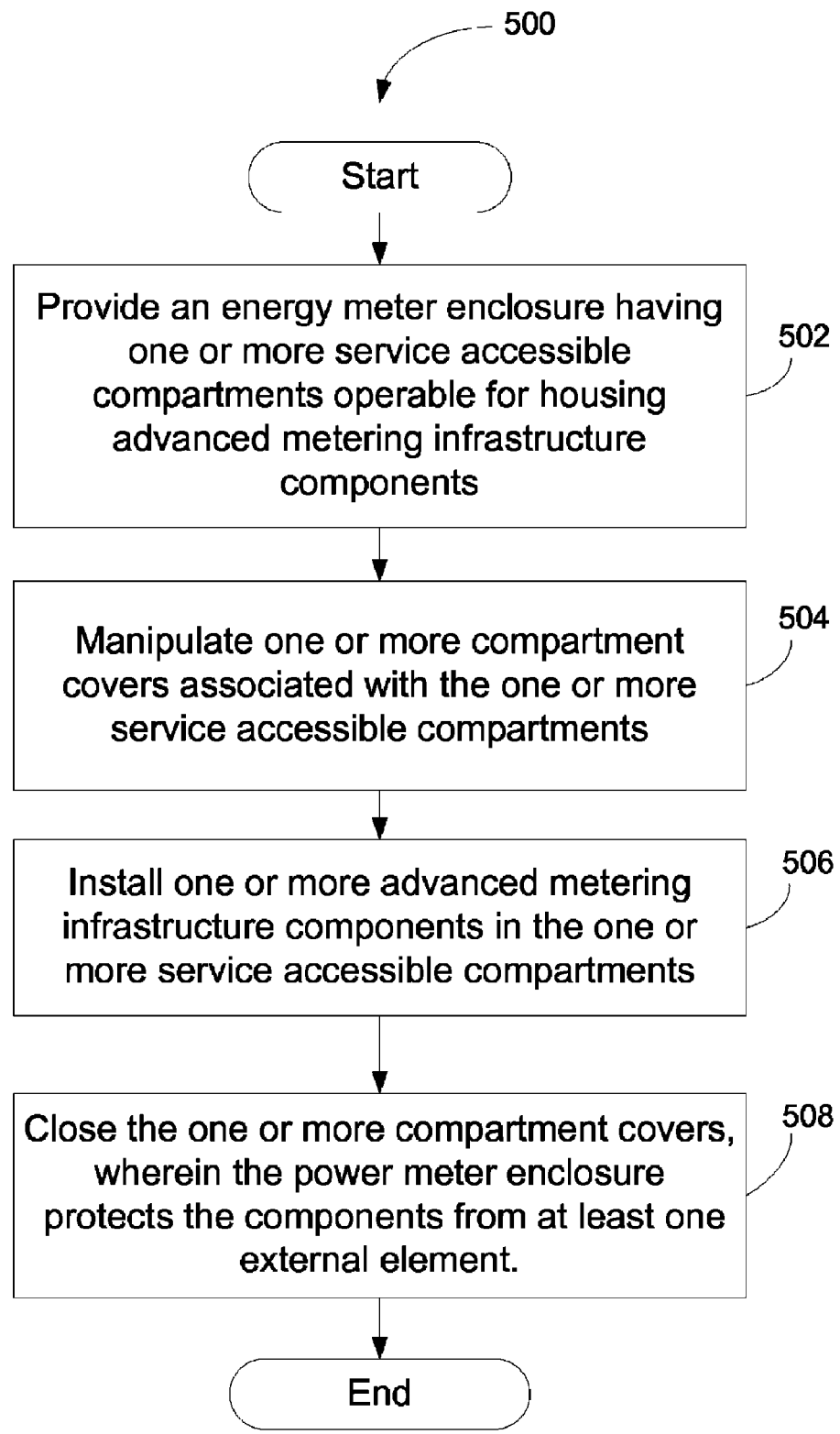
FIG. 5 is a flow diagram of an example method according to an example embodiment of the invention.

An example method 500 for accessing electrical meter components in accordance with an embodiment of the invention will now be described with reference to the flow diagram of FIG. 5. The method 500 starts in block 502 and includes providing an energy meter enclosure (102) having one or more service accessible compartments (104, 110) operable for housing advanced metering infrastructure (AMI) components. In block 504, the method 500 includes manipulating one or more compartment covers (108, 114) associated with the one or more service accessible compartments (104, 110). In block 506, the method 500 includes installing one or more AMI components in the one or more service accessible compartments (104, 110). In block 508, the method 500 includes closing the one or more compartment covers (108, 114), wherein the energy meter enclosure (102) protects the AMI components from at least one external element. The method 500 ends after block 508.

Accordingly, example embodiments of the invention can provide the technical effects of creating certain systems, methods, and apparatus that provide provisions for a field replaceable AMI card. Example embodiments of the invention can provide the further technical effects of providing systems, methods, and apparatus that provide provisions for a field replaceable backup battery or super capacitor assembly. Example embodiments of the invention can provide the further technical effects of providing systems, methods, and apparatus that provide isolated compartments for the AMI card and battery to minimize risk of damaging one component while replacing the other, and/or to isolate catastrophic failures. Example embodiments of the invention can provide the further technical effects of providing systems, methods, and apparatus that provide a current transformer housing to accept coil assemblies from multiple suppliers.

As desired, certain embodiments of the invention may include the meter assembly 100, the current transformer assembly 200, the base assembly, and the battery assembly 400 with more or less of the components illustrated in FIGS. 1, 2, 3, and 4.

The invention is described above with reference to flow diagrams of systems, methods, apparatuses, according to example embodiments of the invention. It will be understood that one or more blocks of the flow diagrams may not necessarily need to be performed in the order presented, or may not necessarily need to be performed at all, according to some embodiments of the invention.

While the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A method for accessing meter components, the method comprising:
   providing a meter enclosure having one or more service accessible compartments operable for housing advanced metering infrastructure (AMI) components;
   manipulating one or more compartment covers associated with the one or more service accessible compartments;
   installing one or more AMI components in the one or more service accessible compartments; and
   closing the one or more compartment covers, wherein the meter enclosure protects the one or more AMI components from at least one external element.

2. The method of claim 1, wherein installing the one or more AMI components comprises installing one or more of a replaceable AMI card or a replaceable battery, wherein a battery compartment for the replaceable battery is separate from an AMI compartment for the replaceable AMI card.

3. The method of claim 1, wherein providing the meter enclosure further comprises providing at least one current sensing assembly for monitoring current.

4. The method of claim 3, wherein providing at least one current sensing assembly comprises providing at least one current transformer assembly, wherein the at least one current transformer assembly comprises a current transformer cap, a current transformer casing and a current transformer.

5. The method of claim 4, wherein providing the at least one current sensing assembly comprises providing a snap-fit enclosure for a current transformer, wherein the snap-fit enclosure comprises a current transformer cap and a current transformer casing.

6. The method of claim 5, wherein the snap-fit enclosure is operable to enclose and secure current transformers ranging in size from about 80% to about 110% of current transformer nominal size.

7. An electrical meter system, comprising:
- at least one electrical power transformer;
- an energy meter enclosure having one or more service accessible compartments, wherein the service accessible compartments are operable for housing advanced metering infrastructure (AMI) components;
- electrical conductors operable for delivering electrical power from the at least one electrical power transformer to the energy meter enclosure;
- one or more compartment covers associated with the one or more service accessible compartments, wherein the one or more compartment covers can be manipulated to access the one or more service accessible compartments; and
- one or more replaceable AMI components in the one or more service accessible compartments.

8. The system of claim 7, wherein the one or more advanced metering infrastructure (AMI) components comprises one or more of a replaceable AMI card or a replaceable battery, and wherein a battery compartment for the replaceable battery is separate from an AMI compartment for the replaceable AMI card.

9. The system of claim 7, wherein the energy meter enclosure further comprises at least one current sensing assembly for monitoring current.

10. The system of claim 9, wherein the at least one current sensing assembly comprises at least one current transformer assembly, wherein the at least one current transformer assembly comprises a current transformer cap, a current transformer casing and a current transformer.

11. The system of claim 7, wherein the at least one current sensing assembly comprises a snap-fit enclosure for housing the current transformer, wherein the snap-fit enclosure comprises a current transformer cap and a current transformer casing.

12. The system of claim 11, wherein the snap-fit enclosure is operable to enclose and secure current transformers ranging in size from about 80% to about 110% of a nominal size for the current transformer.

13. The system of claim 7, further comprising at least one communications channel for transmitting power usage information detected by the AMI components to a utility.

14. An apparatus, comprising:
- an energy meter enclosure having one or more service accessible compartments, wherein the service accessible compartments are operable for housing advanced metering infrastructure (AMI) components;
- one or more compartment covers associated with the one or more service accessible compartments, wherein the one or more compartment covers can be manipulated to access the one or more service accessible compartments; and
- one or more replaceable AMI components in the one or more service accessible compartments.

15. The apparatus of claim 14, wherein the one or more advanced metering infrastructure (AMI) components comprises one or more of a replaceable AMI card or a replaceable battery, and wherein a battery compartment for the replaceable battery is separate from an AMI compartment for the replaceable AMI card.

16. The apparatus of claim 14, wherein the energy meter enclosure further comprises at least one current sensing assembly for monitoring current.

17. The apparatus of claim 16, wherein the at least one current sensing assembly comprises at least one current transformer assembly, wherein the at least one current transformer assembly comprises a current transformer cap, a current transformer casing and a current transformer.

18. The apparatus of claim 17, wherein the at least one current sensing assembly comprises a snap-fit enclosure for housing the current transformer, wherein the snap-fit enclosure comprises a current transformer cap and a current transformer casing.

19. The apparatus of claim 18, wherein the snap-fit enclosure is operable to enclose and secure current transformers ranging in size from about 80% to about 110% of a nominal size for the current transformer.

20. The apparatus of claim 14, further comprising at least one communications channel for transmitting power usage information detected by the AMI components to a utility.

\* \* \* \* \*